US007256057B2

(12) United States Patent
Schardt et al.

(10) Patent No.: US 7,256,057 B2
(45) Date of Patent: Aug. 14, 2007

(54) METHODS FOR PRODUCING PHOSPHOR BASED LIGHT SOURCES

(75) Inventors: Craig R. Schardt, St. Paul, MN (US); John A. Wheatley, Lake Elmo, MN (US); Michael A. Meis, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 133 days.

(21) Appl. No.: 10/938,277

(22) Filed: Sep. 11, 2004

(65) Prior Publication Data

US 2006/0057753 A1    Mar. 16, 2006

(51) Int. Cl.
*H01L 21/66* (2006.01)
(52) U.S. Cl. .............................. 438/14; 438/7; 438/16; 438/34
(58) Field of Classification Search ................. 438/14, 438/7, 10, 16, 17, 29, 34, 35, 69
See application file for complete search history.

(56) References Cited

U.S. PATENT DOCUMENTS

| 5,540,978 | A |   | 7/1996 | Schrenk |  |
|---|---|---|---|---|---|
| 5,813,752 | A |   | 9/1998 | Singer et al. |  |
| 5,882,774 | A |   | 3/1999 | Jonza et al. |  |
| 6,010,751 | A |   | 1/2000 | Shaw et al. |  |
| 6,155,699 | A | * | 12/2000 | Miller et al. | 257/95 |
| 6,172,810 | B1 | * | 1/2001 | Fleming et al. | 359/529 |
| 6,368,699 | B1 |   | 4/2002 | Gilbert et al. |  |
| 6,395,564 | B1 |   | 5/2002 | Huang |  |
| 6,472,765 | B1 | * | 10/2002 | Sano et al. | 257/787 |
| 6,501,091 | B1 |   | 12/2002 | Bawendi et al. |  |
| 6,504,301 | B1 |   | 1/2003 | Lowery |  |
| 6,531,230 | B1 |   | 3/2003 | Weber et al. |  |
| 6,623,142 | B1 |   | 9/2003 | Lippmann et al. |  |
| 6,744,077 | B2 |   | 6/2004 | Trottier et al. |  |
| 6,770,337 | B2 | * | 8/2004 | Debe et al. | 427/146 |
| 6,788,463 | B2 |   | 9/2004 | Merrill et al. |  |
| 6,850,002 | B2 | * | 2/2005 | Danielson et al. | 313/501 |
| 6,858,456 | B2 |   | 2/2005 | Noguchi et al. |  |

(Continued)

FOREIGN PATENT DOCUMENTS

DE    198 45 229 C1    9/2000

(Continued)

OTHER PUBLICATIONS

Schneider, W. E. and Young, R., "Application Note (A14), Spectroradiometry Methods," Optronic Laboratories, Inc. Orlando, FL (1998). URL: http://www.olinet.com/pdfs/A14_Spectroradiometry-Methods.pdf.

*Primary Examiner*—Kevin M. Picardat
(74) *Attorney, Agent, or Firm*—Jay R. Pralle

(57) ABSTRACT

Methods for producing phosphor based light sources are disclosed. One method includes measuring an excitation light output of an LED, forming a plurality of phosphor film articles, measuring an optical characteristic of each of the plurality of phosphor film articles, selecting one of the plurality of phosphor film articles based on the LED excitation light output and measured optical characteristic of the one of the plurality of phosphor film articles to obtain a desired emission light output from the phosphor film article when the phosphor film article is positioned to receive the excitation light, and positioning the phosphor film article to receive the excitation light.

25 Claims, 3 Drawing Sheets

U.S. PATENT DOCUMENTS

| | | |
|---|---|---|
| 6,917,057 B2 * | 7/2005 | Stokes et al. .................. 257/98 |
| 2002/0017651 A1 | 2/2002 | Kato et al. |
| 2002/0030444 A1 | 3/2002 | Muller-Mach et al. |
| 2002/0043926 A1 | 4/2002 | Takahashi et al. |
| 2002/0063520 A1 | 5/2002 | Yu et al. |
| 2003/0089919 A1 | 5/2003 | Ishii et al. |
| 2003/0217806 A1 | 11/2003 | Tait et al. |
| 2004/0070338 A1 | 4/2004 | Noguchi et al. |
| 2004/0090161 A1 | 5/2004 | Noguchi et al. |
| 2004/0116033 A1 | 6/2004 | Ouderkirk et al. |
| 2004/0145312 A1 * | 7/2004 | Ouderkirk et al. .......... 313/512 |
| 2004/0145913 A1 * | 7/2004 | Ouderkirk et al. .......... 362/555 |

FOREIGN PATENT DOCUMENTS

| | | |
|---|---|---|
| DE | 100 65 381 A1 | 7/2002 |
| EP | 733919 A2 | 9/1996 |
| EP | 1 403 936 A2 | 3/2004 |
| KR | 2005091161 | 9/2005 |
| WO | WO97/01778 | 1/1997 |
| WO | WO 97/50132 | 12/1997 |
| WO | WO 00/21061 | 4/2000 |
| WO | WO 01/75490 | 10/2001 |
| WO | WO 02/052615 | 7/2002 |

* cited by examiner

METHODS FOR PRODUCING PHOSPHOR BASED LIGHT SOURCES

BACKGROUND

The present invention relates to methods for producing light sources. More particularly, the present invention relates to methods for producing light sources in which light emitted from a light emitting diode (LED) impinges upon and excites a phosphor material, which in turn emits visible light.

White light sources that utilize LEDs in their construction can have two basic configurations. In one, referred to herein as direct emissive LEDs, white light is generated by direct emission of different colored LEDs. Examples include a combination of a red LED, a green LED, and a blue LED, and a combination of a blue LED and a yellow LED. In the other basic configuration, referred to herein as LED-excited phosphor LED, a single LED generates a beam in a narrow range of wavelengths, which beam impinges upon and excites a phosphor material to produce visible light. The phosphor can comprise a mixture or combination of distinct phosphor materials, and the light emitted by the phosphor can include a plurality of narrow emission lines distributed over the visible wavelength range such that the emitted light appears substantially white to the unaided human eye.

One example of a phosphor LED is a blue LED illuminating a phosphor that converts blue to both red and green wavelengths. A portion of the blue excitation light is not absorbed by the phosphor, and the residual blue excitation light is combined with the red and green light emitted by the phosphor. Another example of a phosphor LED is an ultraviolet (UV) LED illuminating a phosphor that absorbs and converts UV light to red, green, and blue light.

Some advantages of white light phosphor LEDs over direct emission white LEDs include, for example, better color stability as a function of device aging and temperature, and better batch-to-batch and device-to-device color uniformity or repeatability. However, phosphor LEDs can be less efficient than direct emission LEDs, due in part to inefficiencies in the process of light absorption and re-emission by the phosphor.

A fundamental problem of optical variation exists at each stage of the manufacture of the phosphor LED. For example, in the manufacture of gallium nitride LEDs, a large number of LEDs are made simultaneously on a single substrate wafer. On this single wafer there can be a variation of peak emission wavelength that can vary from several nanometers to tens of nanometers across the LED wafer. Subsequent deposition of phosphor also adds optical variability to the completed phosphor LED. Process control of phosphor/binder mixture composition, uniformity, and deposition thickness can be problematic for manufacturers trying to achieve uniformity in phosphor LED packages that can be less than one cubic millimeter in volume. Variations in mixture viscosity, mixture homogeneity, raw material homogeneity, and surface tension all combine to make dispensing/depositing a uniform amount of phosphor difficult and costly. These issues combine to produce problems with several phosphor LED attributes such as, for example, color, brightness, angular uniformity, and electrical to optical efficiency.

SUMMARY

Generally, the present invention relates to methods for making light sources in which light emitted from a light emitting diode (LED) impinges upon and excites a phosphor material, which in turn emits visible light.

In one embodiment, a method includes measuring an excitation light output of an LED, forming a plurality of phosphor film articles, measuring an optical characteristic of each of the plurality of phosphor film articles, selecting one of the plurality of phosphor film articles based on the LED excitation light output and measured optical characteristic of the one of the plurality of phosphor film articles to obtain a desired emission light output from the phosphor film article when the phosphor film article is positioned to receive the excitation light, and positioning the phosphor film article to receive the excitation light.

In another embodiment, a method includes providing a plurality of LEDs, measuring an excitation light output of each of the plurality of LEDs, sorting each of the plurality of LEDs based on the excitation light output of each of the plurality of LEDs to form one or more groups of LEDs, each group of LEDs having substantially similar excitation light output, selecting an LED from a group of LEDs having substantially similar excitation light output, forming a plurality of phosphor film articles, measuring an optical characteristic of each of the plurality of phosphor film articles, selecting one of the plurality of phosphor film articles based on the selected LED excitation light output and measured optical characteristic of the one of the plurality of phosphor film articles to obtain a desired emission light output from the phosphor film article when the phosphor film article is positioned to receive the excitation light from the selected LED, and positioning the phosphor film article to receive the excitation light from the selected LED.

The above summary is not intended to describe each disclosed embodiment or every implementation of the present invention. The Figures, Description and Examples which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

DESCRIPTION

Figure 1:
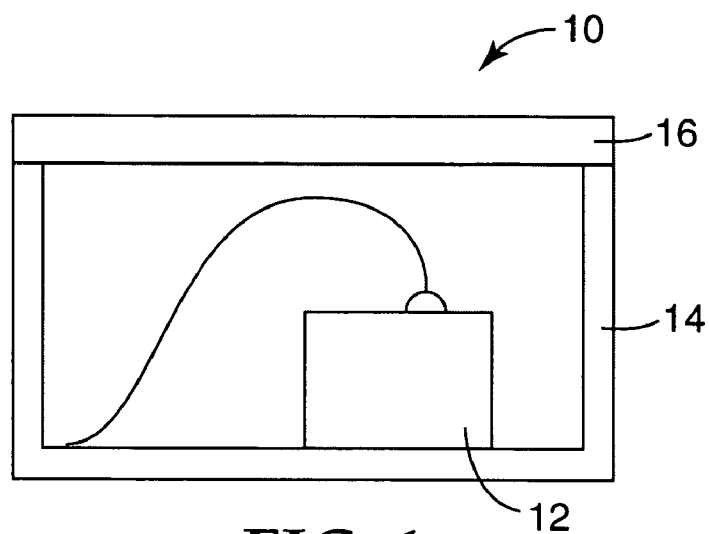
FIG. 1 is a schematic sectional view of a LED-excited phosphor-based light source (phosphor LED)

The present invention relates to methods for producing light sources in which light emitted from a light emitting diode (LED) impinges upon and excites a phosphor material, which in turn emits visible light. Methods are described where LED excitation light is measured, a phosphor film article is formed and an optical characteristic is measured, and the phosphor film article is selected and positioned to receive the LED excitation light. Selection can be based, at least in part, on the LED excitation light output and the measured optical characteristic of the phosphor film article in order to obtain a desired emission light output from the phosphor film article.

The present application discloses LEDs that utilize, in some embodiments, a phosphor on or in a polymer film such as, for example, a multilayer optical film for the filtering components, i.e., long pass (LP) and short pass (SP) interference reflectors. The multilayer optical films can include individual optical layers, at least some of which are birefringent, arranged into optical repeat units through the thickness of the film. Adjacent optical layers can have refractive index relationships that maintain reflectivity and avoid leakage of p-polarized light at moderate to high incidence angles. A SP interference reflector includes optical repeat units having a thickness gradient that produces a reflection band positioned to reflect visible light emitted by the phosphor and transmit UV excitation light. A LP interference reflector includes optical repeat units having a different thickness gradient that produces a reflection band positioned to reflect the UV excitation light and transmit the visible light emitted by the phosphor. As a component of the LED, the flexible phosphor film or film(s) can have a flat configuration or at least one can be embossed or otherwise shaped to be curved, whether in the shape of a sphere, paraboloid, ellipsoid, or other shape.

Methods of manufacturing phosphor LEDs are disclosed, which methods include forming a phosphor film article that includes a polymer film and a phosphor layer. In some cases the phosphor can be sandwiched between two polymer films, for example, one SP interference reflector, and one LP interference reflector. In other cases the phosphor layer can be applied to only one polymer film such as a SP interference reflector or a LP interference reflector, for example. The polymer film(s) and phosphor layer form a phosphor film article. Individual pieces of the phosphor film articles can be positioned to receive excitation light from a separately manufactured LED component or package.

For the following defined terms, these definitions shall be applied, unless a different definition is given in the claims or elsewhere in this specification.

The term "LED" refers to a diode that emits light, whether visible, ultraviolet, or infrared, and whether coherent or incoherent. The term as used herein includes incoherent (and usually inexpensive) polymer-encased semiconductor devices marketed as "LEDs", whether of the conventional or super-radiant variety. The term as used herein also includes semiconductor laser diodes and diodes that are not polymer-encased.

The term "visible light" refers to light that is perceptible to the unaided human eye, generally in the wavelength range from about 400 to 700 nm.

The term "reflection band" refers to a spectral region of relatively high reflectance bounded on either side by regions of relatively low reflectance.

The term "ultraviolet" or "UV" refers to light whose wavelength is in the range from about 300 to about 400 nm.

The term "white light" refers to light that stimulates the red, green, and blue sensors in the human eye to yield an appearance that an ordinary observer would consider "white". Such light may be biased to the red (commonly referred to as warm white light) or to the blue (commonly referred to as cool white light). Such light can have a color rendering index of up to 100.

The term "adjacent" is defined herein to denote a relative positioning of two articles that are near one another. Adjacent items can be touching, or spaced away from each other with one or more materials disposed between the adjacent items.

Unless otherwise indicated, all numbers expressing quantities of elements, optical characteristic properties, and so forth used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The recitation of numerical ranges by endpoints includes all numbers subsumed within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. Thus, for example, reference to a composition containing "a phosphor" includes a mixture of two or more phosphors. As used in this specification and the appended claims, the term "or" is generally employed in its sense including "and/or" unless the content clearly dictates otherwise.

A white light phosphor LED can include a UV emitting semiconductor die (chip) in a reflective heat sink. The reflective heat sink can also serve to partially collimate the UV light. The UV light can illuminate the underside of a phosphor film article, which absorbs at least a portion of the UV light and emits light at multiple wavelengths in the visible region to provide a source appearing substantially white to the ordinary observer. FIG. 1 shows one schematic configuration of such a phosphor LED 10.

The illustrative phosphor LED 10 includes a semiconducting LED 12 mounted in a well of an LED housing 14 that can reflect some of the light emitted from LED 12 toward a phosphor film article 16. The phosphor film article 16 can be positioned to receive excitation light emitted by the LED 12.

In some embodiments, the phosphor film article 16 can reside within the phosphor LED package, for example, in an optically transparent potting material (not shown) which can be shaped to provide a lens feature to tailor the light emitted by phosphor LED 10. In other embodiments, the phosphor film article 16 can be disposed on the LED 12, on the housing (package) 14, or spaced away from (or adjacent to) the phosphor LED package 10.

The phosphor film article can include polymeric material and phosphor material. In some embodiments, the phosphor material can form a phosphor layer. The phosphor layer can include a polymeric binder material. In some embodiments, the phosphor film article can include a phosphor material and a polymeric binder material disposed on a carrier film. The carrier film can be removed from the phosphor film article prior to or following positioning the phosphor film article to receive excitation light.

The phosphor layer can be disposed on or within a polymer layer or film. The polymer layer can be formed of any useful polymer material and can transmit all or a portion of the LED excitation light. The polymer layer can act as an interference reflector reflecting a portion of the LED excitation light and/or reflecting a portion of the phosphor emission light. In some embodiments, the polymer layer can absorb a portion of the LED excitation light and/or absorb a portion of the phosphor emission light, as desired.

In some embodiments, the performance of phosphor LEDs can be increased by using polymeric multilayer optical films, i.e., films having tens, hundreds, or thousands of alternating layers of at least a first and second polymer material, whose thicknesses and refractive indices are selected to achieve a desired reflectivity in a desired portion of the spectrum, such as a reflection band limited to UV wavelengths or a reflection band limited to visible wavelengths. See, for example, U.S. Pat. No. 5,882,774 (Jonza et al.). Although reflection bands produced by these films also experience a blue-shift with incidence angle similar to the blue-shift associated with stacks of inorganic isotropic materials, the polymeric multilayer optical films can be processed so that adjacent layer pairs have matching or near-matching, or deliberately mismatched refractive indices associated with a z-axis normal to the film such that the reflectivity of each interface between adjacent layers, for p-polarized light, decreases slowly with angle of incidence, is substantially independent of angle of incidence, or increases with angle of incidence away from the normal. Hence, such polymeric multilayer optical films can maintain high reflectivity levels for p-polarized light even at highly oblique incidence angles, reducing the amount of p-polarized light transmitted by the reflective films compared to conventional inorganic isotropic stack reflectors. In order to achieve these properties, the polymer materials and processing conditions are selected so that, for each pair of adjacent optical layers, the difference in refractive index along the z-axis (parallel to the thickness of the film) is no more than a fraction of the refractive index difference along the x- or y- (in-plane) axes, the fraction being 0.5, 0.25, or even 0.1. Alternatively, the refractive index difference along the z-axis can be opposite in sign to the in-plane refractive index differences.

The use of polymeric multilayer optical films also makes available a variety of new phosphor LED embodiments and methods of construction due to the flexibility and formability of such films, whether or not they also have the refractive index relationships referred to above as described in U.S. 2004/0116033. For example, polymeric multilayer optical film can be permanently deformed by embossing, thermoforming, or other known means to have a 3-dimensional shape such as a portion of a paraboloid, a sphere, or an ellipsoid. See generally, U.S. 2002/0154406 (Merrill et al.). See also U.S. Pat. No. 5,540,978 (Schrenk) for additional polymeric multilayer film embodiments. Unlike conventional inorganic isotropic stacks, which are normally vapor deposited layer-by-layer onto a rigid, brittle substrate, polymeric multilayer optical films can be made in high volume roll form, and can also be laminated to other films and coated, and can be die cut or otherwise subdivided into small pieces for easy incorporation into an optical system such as a phosphor LED as further explained below. Suitable methods of subdividing polymeric multilayer optical film are disclosed in U.S. 2003/0217806.

A wide variety of polymer materials are suitable for use in multilayer optical films for phosphor LEDs. However, particularly where the phosphor LED comprises a white-light phosphor emitter coupled with a UV LED excitation source, the multilayer optical film preferably comprises alternating polymer layers composed of materials that resist degradation when exposed to UV light. In this regard, a particularly preferred polymer pair is polyethylene terephthalate (PET)/co-polymethylmethacrylate (co-PMMA). The UV stability of polymeric reflectors can also be increased by the incorporation of non-UV absorbing light stabilizers such as hindered amine light stabilizers (HALS). In some cases the polymeric multilayer optical film can also include transparent metal or metal oxide layers. See e.g., PCT Publication WO 97/01778 (Ouderkirk et al.). In applications that use particularly high intensity UV light that would unacceptably degrade even robust polymer material combinations, it may be beneficial to use inorganic materials to form the multilayer stack. The inorganic material layers can be isotropic, or can be made to exhibit form birefringence as described in PCT Publication WO 01/75490 (Weber) and thus have the beneficial refractive index relationships that yield enhanced p-polarization reflectivity as described above. However, in some embodiments it is convenient and cost effective for the multilayer optical film to be substantially completely polymeric, free of inorganic materials.

Figure 2:
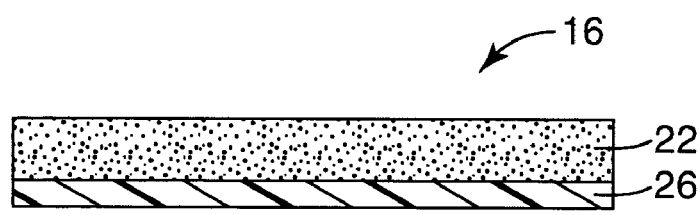
FIG. 2 is a sectional view of an illustrative phosphor interference reflector assembly used in the source of FIG. 1.

One illustrative phosphor film article 16 is shown in greater detail in FIG. 2. The phosphor is formed into a phosphor layer 22 from a combination of one or more phosphor materials mixed with a binder, as desired. A short-pass (SP) interference reflector 26 reflects visible light but transmits UV light, can be applied to the bottom of the phosphor layer 22. This phosphor film article 16 can be positioned to receive LED excitation light such that the excitation light first passes through the SP interference reflector 26 and into the phosphor layer 22. In other embodiments, the phosphor layer 22 is disposed on a polymeric film or layer 26 that does not reflect LED excitation light and/or phosphor emission light.

Figure 3:
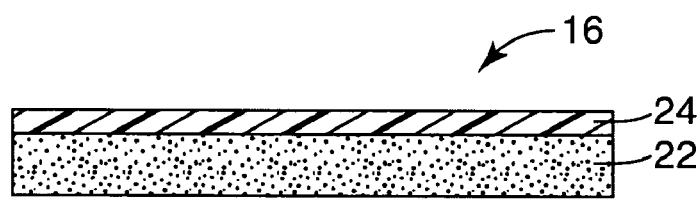
FIG. 3 is a sectional view of an illustrative phosphor interference reflector assembly used in the source of FIG. 1.

Another illustrative phosphor film 16 is shown in greater detail in FIG. 3. The phosphor is formed into a phosphor layer 22 from a combination of one or more phosphor materials mixed with a binder, as desired. A long-pass (LP) interference reflector 24, which reflects UV light but transmits visible light, can be applied to the top of the phosphor layer 22. This phosphor film article 16 can be positioned to receive LED excitation light such that the excitation light first passes through the phosphor layer 22 and then into the LP interference reflector 24 and back into the phosphor layer 22. In other embodiments, the phosphor layer 22 is disposed on a polymeric film or layer 24 that does not reflect LED excitation light and/or phosphor emission light.

Figure 4:
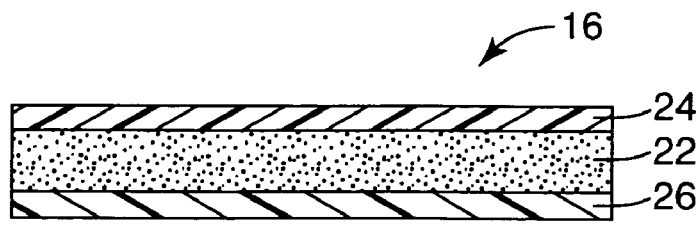
FIG. 4 is a sectional view of an illustrative phosphor interference reflector assembly used in the source of FIG. 1.

Another illustrative phosphor film article 16 is shown in greater detail in FIG. 4. The phosphor is formed into a phosphor layer 22 from a combination of one or more phosphor materials mixed with a binder, as desired. A LP interference reflector 24 reflects UV light but transmits visible light, can be applied to the top of the phosphor layer 22. A SP interference reflector 26 reflects visible light but transmits UV light, can be applied to the bottom of the phosphor layer 22. This phosphor film article 16 can be positioned to receive LED excitation light such that the excitation light first passes through the SP interference reflector 26 and then into the phosphor layer 22 and then into the LP interference reflector 24. In still other embodiments, the phosphor layer 22 is disposed between two polymeric films or layers 24, 26 that do not reflect LED excitation light and/or phosphor emission light.

The optimum thickness of the phosphor layer for a given phosphor concentration is a compromise between efficiently absorbing the UV light (favoring an optically thick phosphor layer) and efficiently emitting visible light (favoring an optically thin phosphor layer). Further, since the intensity of UV light is greatest at the bottom of phosphor layer 22, and useful light is being extracted from the top of phosphor layer 22, increasing the thickness of phosphor layer 22 above the optimum thickness will rapidly reduce overall phosphor LED output and efficiency.

The presence of LP interference reflector 24 and SP interference reflector 26 can enhance the efficiency of phosphor LED 10. The LP interference reflector 24 reflects the UV light that is not absorbed by phosphor layer 22, and that would otherwise be wasted, back onto the phosphor layer 22. This increases the effective path length of the UV light through the phosphor layer, increasing the amount of UV light absorbed by the phosphor for a given phosphor layer thickness. The optimum phosphor layer thickness can thus be reduced compared to a construction without LP interference reflector 24, thereby increasing the efficiency of light generation.

Another significant loss in the phosphor LED is due to the directionally uncontrolled generation of light in the phosphor layer, resulting in at least a portion of the visible light generated in phosphor layer 22 being directed back towards the LED. Some of this light can be captured by reflection off the sloped walls within the LED package, but much of the light is scattered, absorbed, or reduced in quality. This loss can be reduced by placing a SP interference reflector 26 as shown between the LED and phosphor layer 22.

Figure 5:
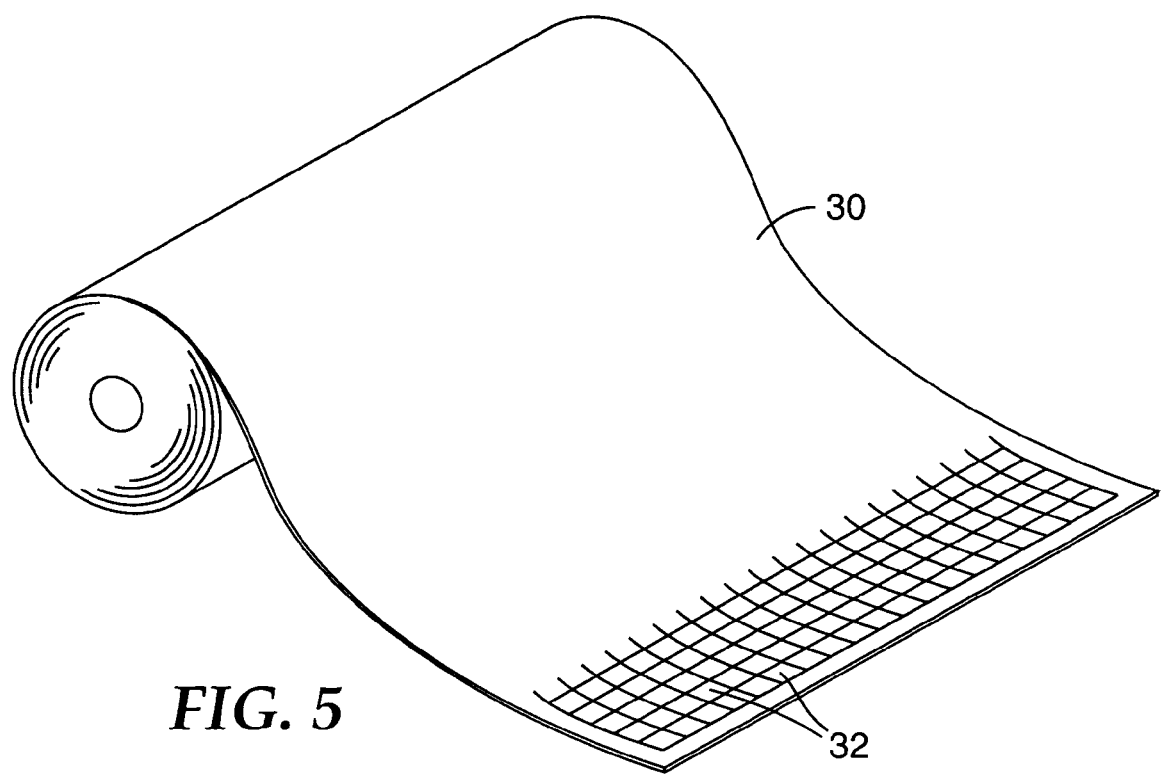
FIG. 5 depicts a roll including a phosphor interference reflector assembly in sheet form and subdivided into individual pieces.

FIG. 5 depicts a roll of sheet material 30, which material includes at least one polymeric (carrier) film (which in some embodiments can be a polymeric multilayer optical film) and a substantially uniform phosphor layer applied to the polymeric film by a coating operation. The sheet material can also comprise a second polymeric film applied in such a way that the phosphor layer is sandwiched between the first and second polymeric films, as seen in FIG. 4. Additional layers and coatings providing desired mechanical, chemical, and/or optical properties can also be included. See U.S. Pat. No. 6,368,699 (Gilbert et al.). In some embodiments, the sheet material 30 includes a carrier film. The sheet material can be kiss-cut by mechanical means such as a knife, precision die cutting, or by scanning laser radiation as described in U.S. 2003/0217806. The kiss-cut lines define discrete pieces 32 of the sheet material, but exclusive of the carrier film which remains intact. The pieces 32 can have a cross-sectional construction similar to that shown in FIGS. 2–4, and can be of arbitrarily small size. They can be conveniently carried by the underlying carrier film. During production of the phosphor LEDs—and independent of the construction of the LED source—pieces 32 can be removed from the carrier film and placed in, on or adjacent individual LEDs.

Illustrative embodiments disclosed herein are operative with a variety of phosphor materials. The phosphor materials are typically inorganic in composition, having excitation wavelengths in the 300–475 nm range and emission wavelengths in the visible wavelength range. In the case of phosphor materials having a narrow emission wavelength range, a mixture of phosphor materials can be formulated to achieve the desired color balance, as perceived by the viewer, for example a mixture of red-, green- and blue-emitting phosphors. Phosphor materials having broader emission bands are useful for phosphor mixtures having higher color rendition indices. Desirably, phosphors should have fast radiative decay rates. A phosphor blend can comprise phosphor particles in the 1–25 μm size range dispersed in a binder such as epoxy, adhesive, or a polymeric matrix, which can then be applied to a substrate, such as a film, for example. Phosphors that convert light in the range of about 300 to 475 nm to longer wavelengths are well known in the art. See, for example, the line of phosphors offered by Phosphor Technology Ltd., Essex, England. Phosphors include rare-earth doped garnets, silicates, and other ceramics. The term "phosphor" as used herein can also include organic fluorescent materials, including fluorescent dyes and pigments. Materials with high stability under 300–475 nm radiation are preferred, particularly inorganic phosphors.

The interference reflector described herein includes reflectors that are formed of organic, inorganic, or a combination of organic and inorganic materials. The interference reflector can be a multilayer interference reflector. The interference reflector can be a flexible interference reflector. A flexible interference reflector can be formed from polymeric, non-polymeric materials, or polymeric and non-polymeric materials. Exemplary films including a polymeric and non-polymeric material are disclosed in U.S. Pat. Nos. 6,010,751 and 6,172,810 and EP 733,919A2.

The polymeric film such as, for example, an interference reflector can be formed from flexible, plastic, or deformable materials and can be flexible, plastic or deformable. These polymeric films can be deflectable or curved to a radius usable with conventional LEDs, i.e., from 0.5 to 10 mm. These flexible polymeric films can be deflected or curved and still retain its pre-deflection optical properties.

Known self-assembled periodic structures, such as cholesteric reflecting polarizers and certain block copolymers, are considered to be multilayer interference reflectors for purposes of this application. Cholesteric mirrors can be made using a combination of left and right handed chiral pitch elements.

In one illustrative embodiment, a LP interference filter that partially transmits all wavelengths of blue light can be used in combination with a thin yellow phosphor layer in order to direct some blue light from the LED back onto the phosphor layer after the first pass through the phosphor.

In addition to providing reflection of UV light, a function of a multilayer optical film can be to block transmission of UV light so as to prevent degradation of subsequent elements inside or outside the LED package, including prevention of human eye damage. In some embodiments, it may be advantageous to incorporate a UV absorber on the side of the UV reflector furthest away from the LED. This UV absorber can be in, on, or adjacent to the multilayer optical film.

Although a variety of methods are known in the art for producing interference reflectors, an all polymer construction can offer several manufacturing and cost benefits. If high temperature polymers with high optical transmission and large index differentials are utilized in the of an interference reflector, then an environmentally stable reflector that is both thin and very flexible can be manufactured to meet the optical needs of SP and LP interference reflectors. In particular, coextruded multilayer interference filters as taught in U.S. Pat. No. 6,531,230 (Weber et al.) can provide precise wavelength selection as well as large area, cost effective manufacturing. The use of polymer pairs having high index differentials allows the construction of very thin, highly reflective mirrors that are freestanding, i.e. have no substrate but are still easily processed. Such interference structures will not crack or shatter or otherwise degrade either when thermoformed or when flexed to a radius of curvature as small as 1 mm.

An all polymeric film can be thermoformed into various 3D shapes such as e.g. hemispherical domes (as described below). However, care must be taken to control the thinning to the correct amount over the entire surface of the dome to create the desired angular performance. Films having a simple two dimensional curvature are easier to create than 3D, compound shaped films. In particular, any thin and flexible film can be bent into a 2D shaped such as, e.g., a part of a cylinder, in this case an all polymeric film is not needed. Multilayer inorganic films on thin polymeric substrates can be shaped in this manner, as well as can inorganic multilayers on glass substrates that are less than 200 μm in thickness. The latter may have to be heated to temperatures near the glass transition point to obtain a permanent shape with low stress.

LED excitation light can be any light that an LED source can emit. LED excitation light can be UV or blue light. Blue light also includes violet and indigo light. LEDs include spontaneous emission devices as well as devices using stimulated or super radiant emission including laser diodes and vertical cavity surface emitting laser diodes.

Layers of phosphor described herein can be a continuous or discontinuous layer. The layers of phosphor material can be a uniform or non-uniform pattern. The layer of phosphor material can be plurality of regions having a small area such as, for example, a plurality of "dots" each having an area in plan view of less than 10000 μm² or from 500 to 10000 μm². In an illustrative embodiment, the plurality of dots can each be formed from a phosphor which emits visible light at one or more different wavelengths such as, for example, a dot emitting red, a dot emitting blue, and a dot emitting green. The dots emitting visible light at a plurality of wavelengths can be arranged and configured in any uniform or non-uniform manner as desired. For example, the layer of phosphor material can be a plurality of dots with a non-uniform density gradient along a surface or an area. The "dots" can have any regular or irregular shape, and need not be round in plan view. Phosphor material can be in a co-extruded skin layer of the multilayer optical film.

Structured phosphor layers can be configured in several ways to provide benefits in performance, as described below. When multiple phosphor types are used to provide broader or fuller spectral output, light from shorter wavelength phosphors can be re-absorbed by other phosphors. Patterns comprising isolated dots, lines, or isolated regions of each phosphor type reduce the amount of re-absorption. This would be particularly effective in cavity type constructions where unabsorbed pump light is reflected back to the phosphor pattern.

Non-scattering phosphor layers can provide enhanced light output in combination with multilayer optical films. Non-scattering phosphor layers can comprise conventional phosphors in an index-matched binder (for example, a binder with high index inert nanoparticles), nanosize particles of conventional phosphor compositions (for examples, where particle sizes are small and negligibly scatter light), or through the use of quantum dot phosphors. Quantum dot phosphors are light emitters based on semiconductors such as cadmium sulfide, wherein the particles are sufficiently small so that the electronic structure is influenced and controlled by the particle size. Hence, the absorption and emission spectra are controlled via the particle size. Quantum dots are disclosed in U.S. Pat. No. 6,501,091.

In an illustrative embodiment, prior to forming the phosphor film article, the surface of a polymeric film can be treated to promote adhesion of the phosphor coating. The optimum treatment depends both on the surface layer of the film and on the materials in the phosphor coating, specifically the binder used to hold the phosphor particles on the surface. The surface treatment can be a standard corona discharge treatment, or a corona discharge followed by a priming layer. The priming layer is typically less than 1 μm thick. Useful priming materials are PVDC, sulphonated polyesters and other amorphous polyesters such as Vitel, maleated copolymers such as Bynel (Dupont) and Admer (Mitsui Chemicals), and EVA such as Elvax (Dupont). Binders for the phosphor layer can be a thermoplastic and/or thermoformable and can be a fluoropolymer, or silicon based material, for example.

Alternative priming layers include, for example, vacuum coated layers, preferably from energetic sources such as ion-beam or gas plasma sources wherein the ions or plasma components bombard the polymer surface while depositing the priming layer. Such priming layers are typically inorganic material layers such as titania or silica layers.

Although much attention has been given to the use of phosphors for down-converting short wavelength light to visible light, it is also possible to up-convert infrared radiation to visible light. Up-converting phosphors are well known in the art and typically use two or more infrared photons to generate 1 visible photon. Infrared LEDs needed to pump such phosphors have also been demonstrated and are very efficient. Visible light sources that use this process can be made more efficient with the addition of LP and SP interference reflectors although the functions of each are reversed in this case compared to the down-converting phosphor systems.

A reflective polarizer can be disposed adjacent the phosphor film article. The reflective polarizer allows light of a preferred polarization to be emitted, while reflecting the other polarization. The phosphor layer and other film components known in the art can depolarize the polarized light reflected by reflective polarizer, and either by the reflection of the phosphor layer, or phosphor layer in combination with the multilayer reflector, light can be recycled and increase the polarized light brightness of the solid state light device (LED). Suitable reflective polarizers include, for example, cholesteric reflective polarizers, cholesteric reflective polarizers with a ¼ wave retarder, wire grid polarizers, or a variety of reflective polarizers available from 3M Company, including DBEF (i.e., a specularly reflective polarizer), and DRPF (i.e., a diffusely reflective polarizer). The reflective polarizer preferably polarizes light over a substantial range of wavelengths and angles emitted by the phosphor, and in the case where the LED emits blue light, may reflect the LED emission wavelength range as well.

Suitable multilayer reflector films are birefringent multilayer optical films in which the refractive indices in the thickness direction of two adjacent layers are substantially matched and have a Brewster angle (the angle at which reflectance of p-polarized light goes to zero) which is very large or is nonexistent. This allows for the construction of multilayer mirrors and polarizers whose reflectivity for p-polarized light decreases slowly with angle of incidence, are independent of angle of incidence, or increase with angle of incidence away from the normal. As a result, multilayer films having high reflectivity (for both planes of polarization for any incident direction in the case of mirrors, and for the selected direction in the case of polarizers) over a wide bandwidth, can be achieved. These polymeric multilayer reflectors include alternating layers of a first and second thermoplastic polymer. The alternating layers defining a local coordinate system with mutually orthogonal x- and y-axes extending parallel to the layers and with a z-axis orthogonal to the x- and y-axes, and wherein at least some of the layers are birefringent. The absolute value of the difference in indices of refraction between the first and second layers is Δx, Δy, and Δz respectively, for light polarized along first, second, and third mutually orthogonal axes. The third axis is orthogonal to the plane of the film where Δx is greater than about 0.05, and where Δz is less than about 0.05. These films are described, for example, in U.S. Pat. No. 5,882,774.

The phosphor film article can be any useable thickness. In some embodiments, the phosphor film article can be 25 to 200 μm thick or 75 to 150 μm thick.

The polymeric interference reflector 26, 24 can be formed of a material that resists degradation when exposed to UV, blue, or violet light, such as discussed herein. The polymeric interference reflectors discussed herein can be stable under high intensity illumination for extended periods of time. High intensity illumination can be generally defined as a flux level from 1 to 100 Watt/cm$^2$. Operating temperatures at the interference reflectors can be 100° C. or less, or 65° or less. Suitable illustrative polymeric materials can include UV resistant material formed from, for example, acrylic material, PET material, PMMA material, polystyrene material, polycarbonate material, THV material available from 3M Company, and combinations thereof. These materials and PEN material can be used for blue excitation light.

The layer of phosphor material 22 is capable of emitting visible light when illuminated with excitation light emitted from an LED 12. The layer of phosphor material 22 can be any useable thickness. The layer of phosphor material 22 can include any number of binders such as, for example, a polyester material. In another illustrative embodiment the layer of phosphor material 22 can include an adhesive material. In a further illustrative embodiment, an adhesive material can be disposed between the layer of phosphor material 22 and the polymeric interference reflector. The adhesive material can be an optically functional adhesive, i.e., it can include additional optical materials such as, for example, dyes, or scattering particles.

The phosphor film article 16 can be formed in a variety of ways. In some embodiments, the layer of phosphor material 22 can be disposed or coated on a polymeric film. The layer of phosphor material 22 can be applied as a flowable material onto the polymeric film. In other embodiments, the layer of phosphor material 22 can be laminated, as a solid layer, adjacent the polymeric film. In addition, the layer of phosphor material 22 and the polymeric film can be thermoformed sequentially or simultaneously. The layer of phosphor can be compressible, elastomeric, and can even be contained in a foamed structure.

As described above, phosphor LED manufacture is plagued with optical variability and imprecise process control. LED manufacturers currently deal with the process variability by 'binning' LED dies by any number of measured optical output properties such as, for example, wavelength and/or luminous intensity, and then re-binning the final phosphor LEDs by any number of measured optical output properties such as, for example, CIE x and y color coordinates, correlated color temperature (CCT) and/or radiant flux. Some LED bins cannot be used for high value applications (such as displays for example) and are relegated to lower value applications such as toys, for example. Additionally, the supply chain becomes complicated and costly due to proliferation of product numbers or SKUs, as well as costs associated with yield losses due to poor control of the manufacturing processes.

In some embodiments of the invention, an LED or plurality of LEDs excitation light output can be measured. One or more phosphor film articles are formed and an optical characteristic of the one or more phosphor film articles can be measured. A phosphor film article can be selected based on the measured excitation light output and the measured optical characteristic of the selected phosphor film article to obtain a desired emission light output when the selected phosphor film article is positioned to receive the excitation light.

Figure 6:
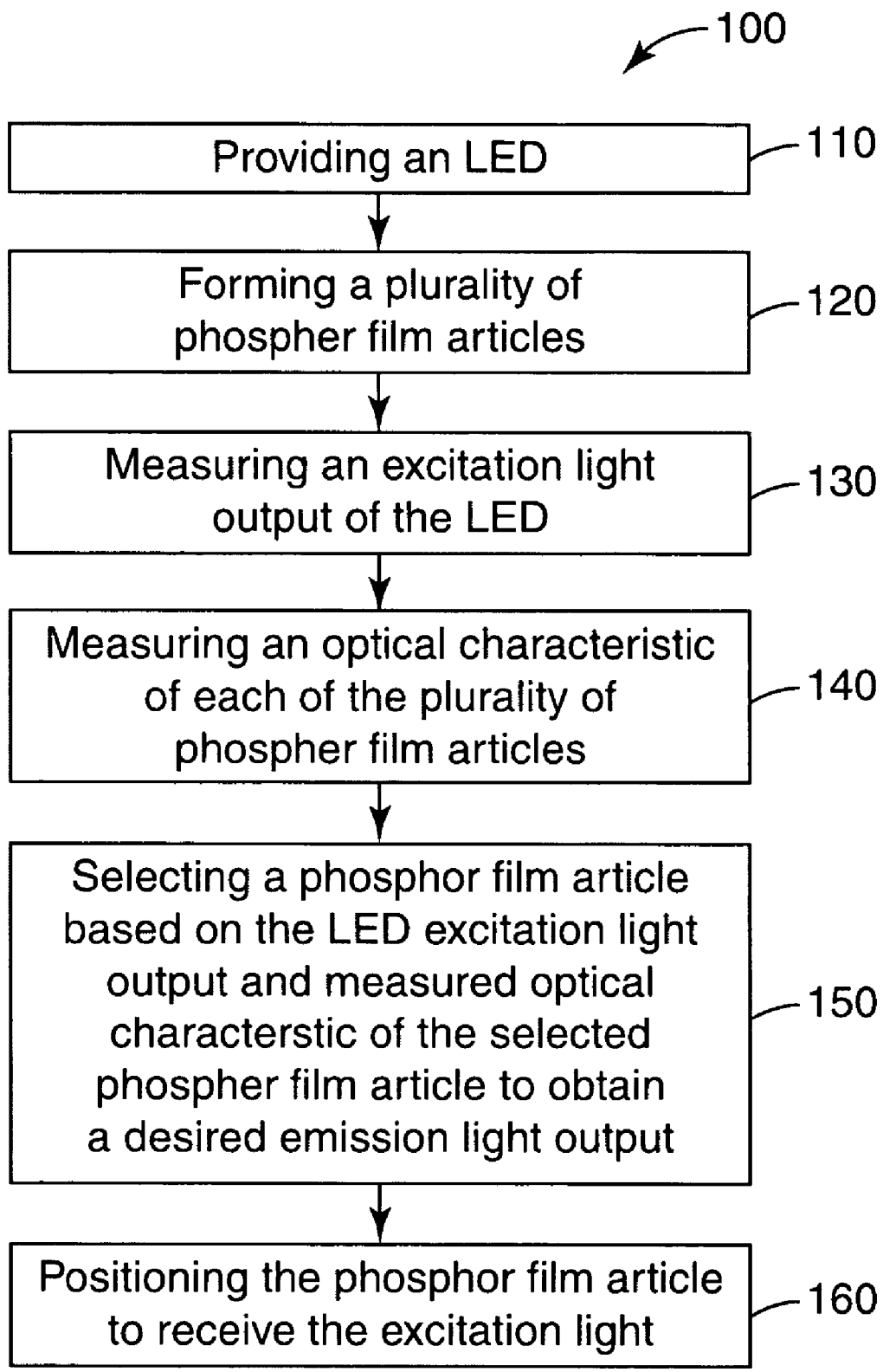
FIG. 6 is a schematic flow diagram of an illustrative method of the invention; and While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention. The Figures are not drawn to any particular scale and are simply presented for ease of illustration.
Figure 6:
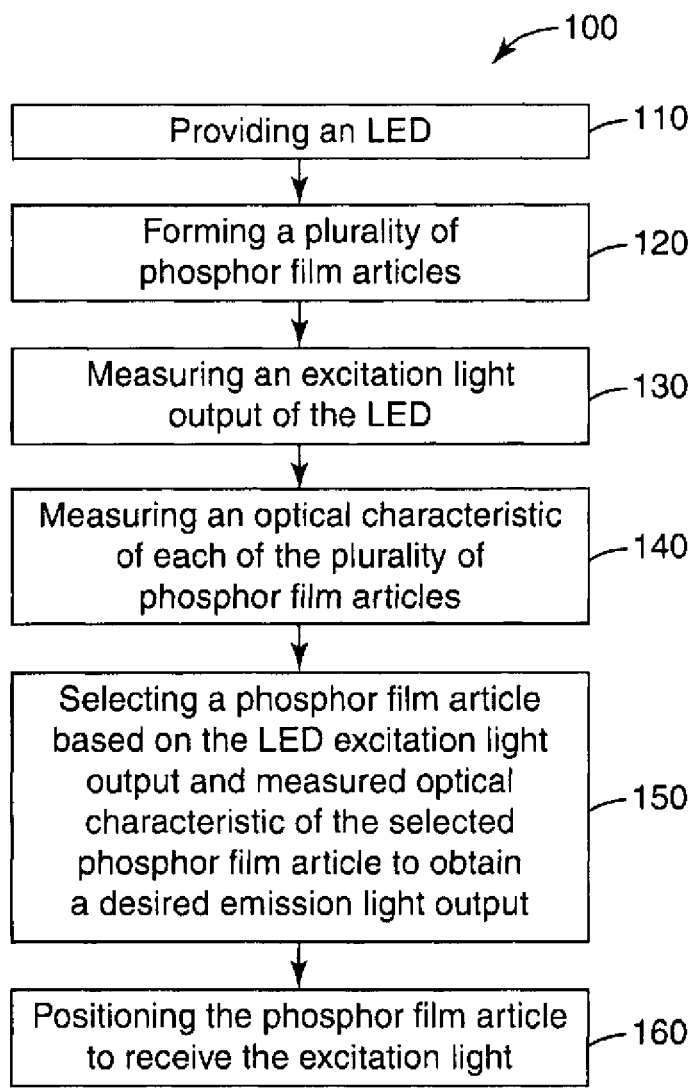

FIG. 6 is a schematic flow diagram 100 of an illustrative method of the invention. This illustrative method includes providing an LED at block 110. A plurality of phosphor film articles are formed at block 120. Excitation light output of the LED is measured at block 130. An optical characteristic is measured for each of the plurality of phosphor film articles at block 140. A phosphor film article is selected based on the LED excitation light output and measured optical characteristic of the selected phosphor film article to obtain a desired emission light output from the phosphor film article when the phosphor film article is positioned to receive the excitation light at block 150. Then, the selected phosphor film article is positioned to receive the LED excitation light at block 160.

Selection of a phosphor film article can be accomplished in a variety of ways. In one embodiment, the color of an LED-phosphor film combination may be estimated by the following interpolation procedure. Two reference LEDs (L1 & L2) having different peak wavelengths (for example, one LED having a peak at 455 nm and the other having a peak at 465 nm) are measured to determine the color coordinates (x, y) corresponding to their emission ($x_{L1}$, $y_{L1}$) and ($x_{L2}$, $y_{L2}$). Here the subscripts denote the reference LED. A phosphor film (P1) is then paired with each of the reference LEDs and the combined output is measured to determine the color coordinates corresponding to the LED+phosphor emission ($x_{L1+P1}$, $y_{L1+P1}$) and ($x_{L2+P1}$, $y_{L2+P1}$) When this film is paired with a new LED (L3), the color of the L3+P1 combination may be estimated by interpolation. One such interpolation method involves calculating the x and y coordinates of the L3+P1 combination by way of the following linear interpolation formulas:

$$x_{L3+P1} = \frac{x_{L2+P1} - x_{L1+P1}}{x_{L2} - x_{L1}}(x_{L3} - x_{L1})$$

$$y_{L3+P1} = \frac{y_{L2+P1} - y_{L1+P1}}{y_{L2} - y_{L1}}(y_{L3} - y_{L1})$$

These formulas will be most accurate when the color coordinates of L3 ($x_{L3}$, $y_{L3}$) are between the color coordinates of L1 and L2. In other words, $x_{L3}$ is between $x_{L1}$ and $x_{L2}$ and $y_{L3}$ is between $y_{L1}$ and $y_{L2}$. The formulas may also be used for extrapolation when one or both of the color coordinates of L3 is outside of these limits; however, the accuracy of the calculation will be reduced. The accuracy and range of validity of the interpolation may be further increased by using additional reference LEDs and using higher-order interpolating functions.

Several phosphor films (P1, P2, P3, . . . ) may be made and characterized as described above. This data can then be used to estimate the color coordinates for each of the films when combined with a new LED (an LED other than the reference LEDs) simply by measuring the color coordinates of the new LED and then performing the calculations detailed above for each of the phosphor films. Based on this calculation, a film can be selected that produces the desired color of white light when paired with the new LED.

In this way, a phosphor film article may be selected from a large number of phosphor film articles to produce the desired color when paired with a given LED. This is not the only possible interpolation scheme, and other procedures based on, for example, dominant wavelength, peak wavelength, or computational simulation may also be used to select a phosphor film. It may be desirable to store the measurement results in a database or other computerized record system and to use a program to automate the calculation and selection procedure.

If no phosphor film is found to adequately produce the proper color when paired with the new LED (L3) then a new phosphor film may be formed to provide the desired white light spectrum. Such a film may require changing the thickness of the phosphor layer or the composition of the phosphor layer.

In one embodiment, a method for doing this is based on an extension to the above described interpolation procedure for selecting phosphor films. The process involves identifying two or more phosphor films that, when paired with L3, are close to the desired color coordinates and then using 1-dimensional or 2-dimensional interpolation procedures to estimate the composition and thickness of a new phosphor layer that would produce the desired color coordinates when paired with L3. A new phosphor film is produced having the calculated composition and thickness and then paired with L3. It may be necessary to iterate this procedure depending on the desired accuracy.

In another embodiment, a method includes the steps of providing a plurality of LEDs, measuring an excitation light output of each of the plurality of LEDs, sorting each of the plurality of LEDs based on the excitation light output of each of the plurality of LEDs to form one or more groups of LEDs, each group of LEDs having substantially similar excitation light output. A plurality of phosphor film articles are formed and an optical characteristic is measured for each of the plurality of phosphor film articles. A phosphor film article is selected based on the excitation light output of a selected group of LEDs and measured optical characteristic of the one of the plurality of phosphor film articles to obtain a desired emission light output from the phosphor film article when the phosphor film article is positioned to receive the excitation light from the selected LED. Then, the phosphor film article is positioned to receive the excitation light of the selected LED.

In some embodiments, measured (or determined) optical characteristics of the phosphor film articles include radiometric quantities and light spectrum of emission light output. Measured (or determined) excitation light output of the LED includes radiometric quantities and light spectrum of excitation light output. A number of radiometric quantities can be used to describe a radiating source.

Some examples of radiometric quantities include radiant energy (i.e., the total energy emitted from a radiating source (J)); radiant energy density (i.e., the radiant energy per unit volume (J m$^{-3}$)); radiant power or radiant flux (i.e., the radiant energy per unit time (J s$^{-1}$ or Watts)); radiant existence (i.e., the total radiant flux emitted by a source divided by the surface area of the source (W m$^{-2}$)); radiant intensity (i.e., the total radiant flux emitted by a source per unit solid angle in a given direction (W sr$^{-1}$)); radiance (i.e., the radiant intensity of a source divided by the area of the source (W sr$^{-1}$ m$^{-2}$)); and emissivity (i.e., the ratio of the radiant flux density of a source to that of a blackbody radiator at the same temperature).

Light spectrum refers to chromaticity values and may be calculated for sources using the CIE 1931 spectral tristimulus values. This calculation is well known and is defined in Schneider, W. E. and Young, R., "Application Note (A14), Spectroradiometry Methods," Optronic Laboratories, Inc. Orlando, Fla. (1998), URL: http://www.olinet.com/ndfs/A14_SPECTRORADIOMETRY-METHODS.pdf. These values can be denoted as CIE x, and CIE y. Correlated color temperature (CCT) calculations are also well known and are based on Robertson's method. See id.

In some embodiments, precision film coating technology can be used to achieve a ±2% phosphor coating thickness accuracy on the phosphor film article. Thus, as the size of the LED packages approach zero, the phosphor deposition control would not change.

LEDs that would otherwise be relegated to a bin for lower value application could be compensated using the techniques described herein and used for a higher value application. The compensation can be accomplished by selecting the appropriate filter and phosphor layer combination for each LED die so that die having significantly different peak wavelengths could be made into phosphor LEDs with nearly identical color coordinates.

Manufacturers of LEDs typically "bin" LEDs by wavelength. A device manufacturer will typically order a quantity of LEDs, requesting that all LEDs be the same (e.g., 460 nm). However, due to the variation problem described herein, the device manufacturer will typically receive groupings of LEDs from different bins (e.g., 455, 460, and 465 nm), which have noticeable color and brightness differences. One advantageous use of color compensation described herein is to compensate a group of LEDs so that the combined emission of more than one LED is corrected to white (as desired), rather than individually correcting each LED. This has the advantage of allowing the use of only one phosphor film as a compensation film.

For example, the manufacturer mentioned above could select one of each LED type (455, 460, and 465 nm) and place them in a common reflective cavity (e.g., a reflective cavity formed from or including ESR available from 3M Company), then select a single color compensation film. The reflective cavity provides spatial spectral mixing, and the film corrects the combined spectral emission to white.

Multiple cavities could then be built in a similar fashion and arranged in an array. In this illustrative case a single large color compensation film could be placed so as to cover multiple cavities.

Multiple phosphor film articles having various optical properties can be produced such that a particular phosphor film article may be selected to provide the desired color when paired with a particular LED. In one exemplary embodiment, nine phosphor films can be manufactured using three different phosphor coating pastes each coated at three different thicknesses on a substrate that includes a sheet of multilayer optical film (MOF) (3M Company). Any suitable coating paste that includes a mixture of phosphor particles and a curable resin system can be used. For example, one coating paste can contain YAG:Ce phosphor, the second can contain (Y,Gd)AG:Ce phosphor, and the third can contain a 50—50 blend (by weight) of the YAG:Ce and (Y,Gd)AG:Ce phosphors. The coating pastes can be made using NOA 81 resin mixed with the phosphor in a ratio of 2 parts resin to 1 part phosphor (by weight). A coater bar can be used to make the coatings. The various coating pastes can be coated onto the substrate at varying thicknesses. For example, the coatings can be applied using coater bar gaps of 100 µm, 110 µm, and 120 µm for each paste. The coatings can then be cured using UV light.

The various phosphor layers can be optically characterized by measuring the excitation spectrum and the emission spectrum. The emission spectrum may be recorded using more than one excitation light source such as LEDs having different emission peak wavelengths. Additional information about the layers may also be recorded, such as the layer thickness, the transmission spectrum of the MOF, and the scattering coefficients of the phosphor layer.

The output of an unknown packaged blue LED can be measured. Based on this measurement and the data from the measurements of the nine phosphor layers, a phosphor layer can be selected for this LED that will result in white light output that most closely matches a predetermined white color point, or a predetermined color bin. The matching process may be improved by using a computer model to predict the actual light output based on the measured properties of the layers and the measured output of the LED. The selected phosphor layer and film can be separated from the substrate to form a phosphor film article using any suitable technique.

The selected phosphor film article can be positioned over the LED and affixed to the LED package. Using this process, blue LEDs having a wide range of output spectra can be converted into white LEDs with very similar color coordinates. Finer control of color can be achieved by selecting a phosphor film article from a larger collection of film articles produced with a larger range of phosphor compositions, coating thicknesses, and MOF band-edges.

All patents and patent applications referenced herein are incorporated by reference in their entirety. Various modifications and alterations of this invention will be apparent to those skilled in the art without departing from the scope and spirit of this invention, and it should be understood that this invention is not limited to the illustrative embodiments set forth herein.

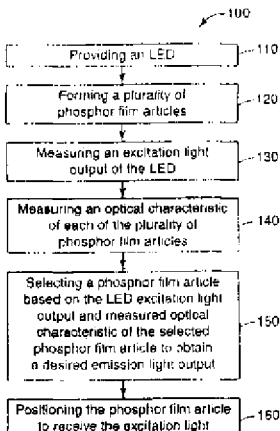

What is claimed is:

1. A method comprising step of:
   measuring an excitation light output of an LED;
   forming a plurality of phosphor film articles comprising a phosphor layer disposed on a flexible polymeric film;
   measuring an optical characteristic of each of the plurality of phosphor film articles;
   selecting one of the plurality of phosphor film articles based on the LED excitation light output and measured optical characteristic of the one of the plurality of phosphor film articles to obtain a desired emission light output from the phosphor film article when the phosphor film article is positioned to receive the excitation light; and
   positioning the phosphor film article to receive the excitation light.

2. A method according to claim 1, wherein the forming step comprises forming a plurality of phosphor film articles comprising a phosphor layer disposed on a polymeric interference reflector.

3. A method according to claim 2, wherein the forming step comprises forming a plurality of phosphor film articles comprising a phosphor layer disposed on a short pass interference reflector.

4. A method according to claim 2, wherein the forming step comprises forming a plurality of phosphor film articles comprising a phosphor layer disposed on a long pass interference reflector.

5. A method according to claim 2, wherein the forming step comprises forming a plurality of phosphor film articles comprising a phosphor layer disposed between a short pass interference reflector and a long pass interference reflector.

6. A method according to claim 1, wherein the measuring step comprises measuring an emission light output radiant flux of each of the plurality of phosphor film articles.

7. A method according to claim 1, wherein the measuring step comprises measuring an emission light output spectrum of each of the plurality of phosphor film articles.

8. A method according to claim 1, wherein the measuring step comprises measuring an emission light output radiant flux and spectrum of each of the plurality of phosphor film articles.

9. A method according to claim 1, wherein the selecting step comprises selecting one of a plurality of phosphor film articles based on the excitation light output to obtain a desired emission light spectrum.

10. A method according to claim 9, wherein the selecting step comprises selecting one of a plurality of phosphor film articles based on the excitation light output to obtain a desired emission light output CIE x, CIE y or CCT value.

11. A method according to claim 1, wherein the selecting step comprises selecting one of a plurality of phosphor film articles based on the excitation light output to obtain a desired emission light output radiant flux and spectrum.

12. A method according to claim 1, further comprising measuring the emission light output after positioning the phosphor film article.

13. A method according to claim 1, wherein the selecting step comprises selecting one of a plurality of phosphor film articles based on the excitation light output to obtain a desired emission light output, wherein the phosphor layer has a phosphor layer thickness that is selected to obtain the desired emission light output.

14. A method according to claim 1, wherein the selecting step comprises selecting one of a plurality of phosphor film articles based on the excitation light output to obtain a desired emission light output, wherein the phosphor of the phosphor layer is selected to obtain the desired emission light output.

15. A method according to claim 1, wherein the selecting step comprises selecting one of a plurality of phosphor film articles based on the excitation light output to obtain a desired emission light output, wherein the phosphor layer comprises a mixture of phosphors and the mixture of phosphors is selected to obtain the desired emission light output.

16. A method according to claim 1, further comprising positioning the phosphor film article to receive excitation light from a plurality of LEDs.

17. A method according to claim 1, wherein the step of positioning the phosphor film article to receive the excitation light comprises disposing the phosphor film article on the LED.

18. A method according to claim 1, wherein the step of positioning the phosphor film article to receive the excitation light comprises disposing the phosphor film article adjacent the LED.

19. A method according to claim 1, wherein the step of positioning the phosphor film article to receive the excitation light comprises disposing the phosphor film article within the LED.

20. A method comprising step of:
providing a plurality of LEDs;
measuring an excitation light output of each of the plurality of LEDs;
sorting each of the plurality of LEDs based on the excitation light output of each of the plurality of LEDs to form one or more groups of LEDs, each group of LEDs having substantially similar excitation light output;
selecting an LED from a group of LEDs having substantially similar excitation light output;
forming a plurality of phosphor film articles comprising a phosphor layer disposed on a polymeric film;
measuring an optical characteristic of each of the plurality of phosphor film articles;
selecting one of the plurality of phosphor film articles based on the selected LED excitation light output and measured optical characteristic of the one of the plurality of phosphor film articles to obtain a desired emission light output from the phosphor film article when the phosphor film article is positioned to receive the excitation light from the selected LED; and
positioning the phosphor film article to receive the excitation light from the selected LED.

21. A method according to claim 20, wherein the sorting step comprises sorting the plurality of LEDs based on the excitation light output radiant flux, light spectrum, or radiant flux and light spectrum of each of the plurality of LEDs to form one or more groups of LEDs having substantially similar excitation light output.

22. A method according to claim 20, wherein the selecting step comprises selecting one of the plurality of phosphor film articles based on the selected LED excitation light output and measured optical characteristic of the one of the plurality of phosphor film articles to obtain a desired emission light output CIE x, CIE y, or CCT value from the phosphor film article when the phosphor film article is positioned to receive the excitation light from the selected LED.

23. A method according to claim 20, wherein the forming step comprises forming a plurality of phosphor film articles comprising an short pass interference reflector, a long pass interference reflector, or a short pass and a long pass interference reflector.

24. A method according to claim 20, wherein the phosphor layer comprises a mixture of phosphors.

25. A method according to claim 20, further comprising positioning the phosphor film article to receive excitation light from the group of LEDs having substantially similar excitation light output.

* * * * *

UNITED STATES PATENT AND TRADEMARK OFFICE
CERTIFICATE OF CORRECTION

PATENT NO. : 7,256,057 B2  Page 1 of 3
APPLICATION NO. : 10/938277
DATED : August 14, 2007
INVENTOR(S) : Craig R. Schardt It is certified that error appears in the above-identified patent and that said Letters Patent is hereby corrected as shown below:

The title page, showing an illustrative figure, should be deleted and substitute therefor the attached title page.

Delete Drawing Sheet 3, and substitute therefor the attached Drawing Sheet 3, containing FIG. 6.

Column 2
Line 55, after "pieces;" insert -- and --.
Line 57, delete "invention; and" and insert -- invention. --, therefor.

Column 12
Line 45 (approx), after "$Y_{L2+P1}$)" insert -- . --.

Column 14
Line 16, delete "/ndfs/" and insert -- /pdfs/ --, therefor.
Line 54-57, delete "Multiple cavities ………..multiple cavities." and insert the same on line 53 after "white." as a continuation of paragraph.

Column 18
Line 2, in Claim 21, after "sorting" insert -- each of --.
Line 7, in Claim 22, after "selecting" insert -- one of the plurality of phosphor film articles --.

Signed and Sealed this

Seventh Day of April, 2009

JOHN DOLL
*Acting Director of the United States Patent and Trademark Office*

United States Patent
Schardt et al.

(10) Patent No.: US 7,256,057 B2
(45) Date of Patent: Aug. 14, 2007

(54) METHODS FOR PRODUCING PHOSPHOR BASED LIGHT SOURCES

(75) Inventors: Craig R. Schardt, St. Paul, MN (US); John A. Wheatley, Lake Elmo, MN (US); Michael A. Meis, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 133 days.

(21) Appl. No.: 10/938,277

(22) Filed: Sep. 11, 2004

(65) Prior Publication Data

US 2006/0057753 A1  Mar. 16, 2006

(51) Int. Cl.
    *H01L 21/66* (2006.01)
(52) U.S. Cl. ............... 438/14; 438/7; 438/16; 438/34
(58) Field of Classification Search ............. 438/14, 438/7, 10, 16, 17, 29, 34, 35, 69
    See application file for complete search history.

(56) References Cited

U.S. PATENT DOCUMENTS

| | | | |
|---|---|---|---|
| 5,540,978 A | 7/1996 | Schrenk | |
| 5,813,752 A | 9/1998 | Singer et al. | |
| 5,882,774 A | 3/1999 | Jonza et al. | |
| 6,010,751 A | 1/2000 | Shaw et al. | |
| 6,155,699 A * | 12/2000 | Miller et al. | 257/95 |
| 6,172,810 B1 * | 1/2001 | Fleming et al. | 359/529 |
| 6,368,699 B1 | 4/2002 | Gilbert et al. | |
| 6,395,564 B1 | 5/2002 | Huang | |
| 6,472,765 B1 * | 10/2002 | Sano et al. | 257/787 |
| 6,501,091 B1 | 12/2002 | Bawendi et al. | |
| 6,504,301 B1 | 1/2003 | Lowery | |
| 6,531,230 B1 | 3/2003 | Weber et al. | |
| 6,623,142 B1 | 9/2003 | Lippmann et al. | |
| 6,744,077 B2 | 6/2004 | Trottier et al. | |
| 6,770,337 B2 * | 8/2004 | Debe et al. | 427/146 |
| 6,788,463 B2 | 9/2004 | Merrill et al. | |
| 6,850,002 B2 * | 2/2005 | Danielson et al. | 313/501 |
| 6,858,456 B2 | 2/2005 | Noguchi et al. | |

(Continued)

FOREIGN PATENT DOCUMENTS

DE  198 45 229 C1  9/2000

(Continued)

OTHER PUBLICATIONS

Schneider, W. E. and Young, R., "Application Note (A14), Spectroradiometry Methods," Optronic Laboratories, Inc. Orlando, FL (1998). URL: http://www.olinet.com/pdfs/A14_Spectroradiometry-Methods.pdf.

*Primary Examiner*—Kevin M. Picardat
(74) *Attorney, Agent, or Firm*—Jay R. Pralle

(57) ABSTRACT

Methods for producing phosphor based light sources are disclosed. One method includes measuring an excitation light output of an LED, forming a plurality of phosphor film articles, measuring an optical characteristic of each of the plurality of phosphor film articles, selecting one of the plurality of phosphor film articles based on the LED excitation light output and measured optical characteristic of the one of the plurality of phosphor film articles to obtain a desired emission light output from the phosphor film article when the phosphor film article is positioned to receive the excitation light, and positioning the phosphor film article to receive the excitation light.

25 Claims, 3 Drawing Sheets